(12) United States Patent
Suzuki et al.

(10) Patent No.: US 7,170,344 B2
(45) Date of Patent: Jan. 30, 2007

(54) MULTI-BAND PREDISTORTER USING POWER SERIES REPRESENTATION

(75) Inventors: Yasunori Suzuki, Yokohama (JP); Shoichi Narahashi, Yokohama (JP); Shinji Mizuta, Yokohama (JP); Yasushi Yamao, Yokosuka (JP)

(73) Assignee: NTT DoCoMo, Inc., Tokyo (JP)

( * ) Notice: Subject to any disclaimer, the term of this patent is extended or adjusted under 35 U.S.C. 154(b) by 96 days.

(21) Appl. No.: 11/045,337

(22) Filed: Jan. 31, 2005

(65) Prior Publication Data

US 2005/0168283 A1    Aug. 4, 2005

(30) Foreign Application Priority Data

Feb. 3, 2004    (JP)    ............... 2004-027220

(51) Int. Cl.
*H03F 1/26*    (2006.01)
(52) U.S. Cl. ...................... 330/149; 375/297
(58) Field of Classification Search ............... 330/149; 375/297; 455/114.2
See application file for complete search history.

(56) References Cited

U.S. PATENT DOCUMENTS 4,604,589 A    8/1986    McGann (Continued)

FOREIGN PATENT DOCUMENTS

| DE | 2 306 294 | 8/1974 |
|---|---|---|
| DE | 100 09 596 A1 | 8/2001 |
| GB | 2 335 812 A | 9/1999 |
| JP | 2002-522989 | 7/2002 |

OTHER PUBLICATIONS

Henri Girard, et al., "A New Baseband Linearizer for More Efficient Utilization of Earth Station Amplifiers Used for QPSK Transmission", IEEE Journal on Selected Areas in Communications, vol. SAC-1, No. 1, Jan. 1983, pp. 46-56.

(Continued)

*Primary Examiner*—Henry Choe
(74) *Attorney, Agent, or Firm*—Oblon, Spivak, McClelland, Maier & Neustadt, P.C.

(57) ABSTRACT

A transmission signal containing signals of a plurality of frequency bands is divided and fed to a linear signal transfer path including a delay circuit and a plurality of distortion generation paths for the plurality of frequency bands. In each distortion generation path, the signal of the corresponding frequency band is extracted by a band signal extractor from the signal fed to the path, an odd-order distortion of the extracted signal is generated by an odd-order distortion generator, and the phase and amplitude of the odd-order distortion are adjusted by a vector adjuster to provide the output signal of the distortion generation path. The output signals from such plurality of distortion generation paths are combined by a combiner with the output from the linear signal transfer path to provide the combined output as the output from a multi-band predistorter using power series representation.

19 Claims, 10 Drawing Sheets

U.S. PATENT DOCUMENTS

| | | | |
|---|---|---|---|
| 4,811,422 A * | 3/1989 | Kahn | 455/114.1 |
| 6,549,067 B1 | 4/2003 | Kenington | |
| 6,762,654 B1 * | 7/2004 | Tanaka | 333/140 |
| 2002/0021764 A1 | 2/2002 | Posti | |

OTHER PUBLICATIONS

Hiroyshi Ishikawa, et al., "Development of Adaptive Predistortion Amplifier for W-CDMA Base Station", 2002 Assembly of the Society of Electronics, Information and Communication Engineers of Japan, C-2-31, Sep. 2002, p. 53 (with partical English translation).

Toshio Nojima, et al., Cuber Predistortion Linearizer for Relay Equipment in 800 MHz Band Land Mobile Telephone System, IEEE Transactions on Vehicular Technology, vol. VT-34, No. 4, Nov. 1985, pp. 169-177.

Tri T. Ha, "Solid-State Microwave Amplifier Design", GTE International System Corporation, Chapter 6, Krieger Publishing Company, 1991, pp. 202-283.

U.S. Appl. No. 11/444,494, filed Jun. 1, 2006, Suzuki et al.
U.S. Appl. No. 11/446,381, filed Jun. 5, 2006, Suzuki et al.

* cited by examiner

US 7,170,344 B2

MULTI-BAND PREDISTORTER USING POWER SERIES REPRESENTATION

BACKGROUND OF THE INVENTION

The present invention relates to a predistorter that compensates for distortions generated by a power amplifier for power amplifying high-frequency signals and, more particularly, to a multi-band predistorter using power series representation (hereinafter, multi-band power series type predistorter) that can be used in common to multiple frequency bands to implement distortion compensation of high-frequency signals of the respective frequency bands.

One of methods that have been proposed to compensate for nonlinear distortions generated by microwave power amplifiers is a predistortion method using a digital signal processing scheme (hereinafter referred to as a digital predistortion method) (for example, UK Patent Application, GB2,335,812A, hereinafter referred to as patent document 1). The digital predistortion method features elimination of the need for complex analog circuitry by implementing a predistorter configuration through utilization of digital signal processing.

There has been known a digital predistorter of the type having a look-up table for pre-linearizing amplifier nonlinearities (for example, H. Girard, and K. Feher, "A New Baseband Linearizer for More Efficient Utilization of Earth Station Amplifiers Used for QPSK Transmission," IEEE J. Select., Area Commun., SAC-1, No. 1, 1983, hereinafter referred to as non-patent document 1, and Japanese patent application laid open No. 2002-522989, hereinafter referred to as patent document 2). The digital predistorter with the look-up table updates values set in the look-up table by feeding back thereto the amplifier output signal to keep the distortion component down under a set value. It is well-known in the art that distortion compensation can be achieved by such digital signal processing, and that the amount of compensation is equal to or smaller than approximately 15 dB (for example, Ishikawa, Hase, Kubo, Tozawa, and Hamano, "Development of Adaptive Predistortion Amplifier for W-CDMA Base Station," 2002 Assembly of the Society of Electronics, Information and Communication Engineers of Japan, C-2-31, 2002, 09, hereinafter referred to as non-patent document 2).

There has also been proposed a predistorter based on a power series model. This predistorter has been implemented by use of analog circuitry and has yielded distortion-suppression performances in excess of 30 dB (non-patent document 3). It is known that the power series model successfully models amplifier nonlinearities with high accuracy (for example, Tri T. Ha, "Solid-State Microwave Amplifier Design," Chapter 6, Krieger Publishing Company, 1991, hereinafter referred to as non-patent document 4). With the distortion compensating method for the digital predistorter using the power series model, it is necessary to extract signals for correcting coefficients of respective order from the amplifier output signal. In patent document 1 the fundamental wave and distortions of respective orders are eliminated or cancelled from the transmission signal to extract such correcting signals. A method for extracting the correcting signals of the power series model with more ease is to use two carrier waves of the same level as pilot signals (for example, T. Nojima, and T. Kanno, "Cuber Predistortion Linearizer for Relay Equipment in 800 MHz Band Land Mobile Telephone System," IEEE Trans. Vech. Tech., Vol. VT-34, No. 4, pp. 169–177, 1985, 11, hereinafter referred to as non-patent document 3).

In a mobile radio communication system that simultaneously performs communication services in two or more discretely separated frequency bands, it is necessary to use predistorters each adapted to meet conditions in a particular frequency band. However, the frequency range over which the conventional predistorter configuration can be adjusted is only about 20 MHz or so about the carrier frequency, and hence, in the PDC (Personal Digital Cellular) system that transmits signals of 800 MHz and 1.5 GHz bands, it is impossible to provide predetermined compensation of the both transmission signals. The conventional predistorter is not provided with a distortion generation path for making distortion compensation satisfactory to every transmission frequency band, and for this reason, it cannot make adjustment for implementing sufficient compensation in the multiple frequency bands. Predistortion processing for multiple frequency bands by one predistorter will ensure realization of a simplified, power consumption saving and miniaturized equipment configuration.

There is also known a method in which multiple power series type predistorters, each having distortion generating means corresponding to one of multiple frequency bands, are configured with a delay line of the prior-art power series type predistorter used in common to the predistorters. With such a method in which the multiple power series type predistorters are configured as if to be in parallel relation to the delay line, transmission signals of the multiple frequency bands are input to the respective distortion generating means. The respective distortion generating means each adjust the amplitude and phase of the input transmission signal in a manner to implement distortion compensation for each particular frequency band. When transmission signals of multiple frequency bands are input to the distortion generating means, it is impossible to make optimum adjustments to the amplitude and phase of the input transmission signal of every frequency band. For example, when the transmission signals are of 800 MHz and 1.5 GHz bands, the distortion generating means is capable of setting optimum amplitude and phase for the transmission signal of the 800 MHz band, but for setting optimum amplitude and phase for the signal of the 1.5 GHz band which is spaced 700 MHz apart in frequency from the 800 MHz, it is necessary to use amplitude and phase setting means capable of operating at a speed high enough to overcome the 700-MHz difference of frequency. But such high-speed amplitude and phase setting means is not available. Thus, even if multiple power series type predistorters each operable in a particular frequency band are used, it is impossible to implement a power series type predistorter configuration operable in multiple frequency bands.

SUMMARY OF THE INVENTION

According to the present invention, a plurality of distortion generation paths for a plurality of frequency bands, each having a band signal extractor for extracting a signal of a particular frequency band and a distortion generator for generating an odd-order distortion component of the extracted signal, are provided in correspondence to the plurality of frequency bands, and an input signal is applied via divider to a linear signal path and the plurality of distortion generation paths, and the outputs from these paths are combined into the output signal of a multi-band power series type predistorter. In this way, a predistorter is configured which implement distortion compensation independently in each of the plurality of frequency bands.

With the power series type predistorter of the present invention, multiple frequency band signals are separated into signals of respective frequency bands, then odd-order distortions are generated for each frequency band, then the distortion components are adjusted for each frequency band so that they suppress distortion components caused by a power amplifier, and the adjusted distortion components are combined with a transmission signal, and the combined output is input to the power amplifier. As the result of this, the odd-order distortion components in the respective frequency bands at the output side of the power amplifier are cancelled.

In other words, the predistorter of the present invention is capable of adjusting the amount of compensation for distortion independently for each frequency band, permitting implementation of distortion compensation in all of the multiple frequency bands. The present invention realizes simple-structured, power consumption saving and miniaturized power series type predistorter.

DETAILED DESCRIPTION OF THE PREFERRED EMBODIMENTS

Embodiment 1

Figure 1:
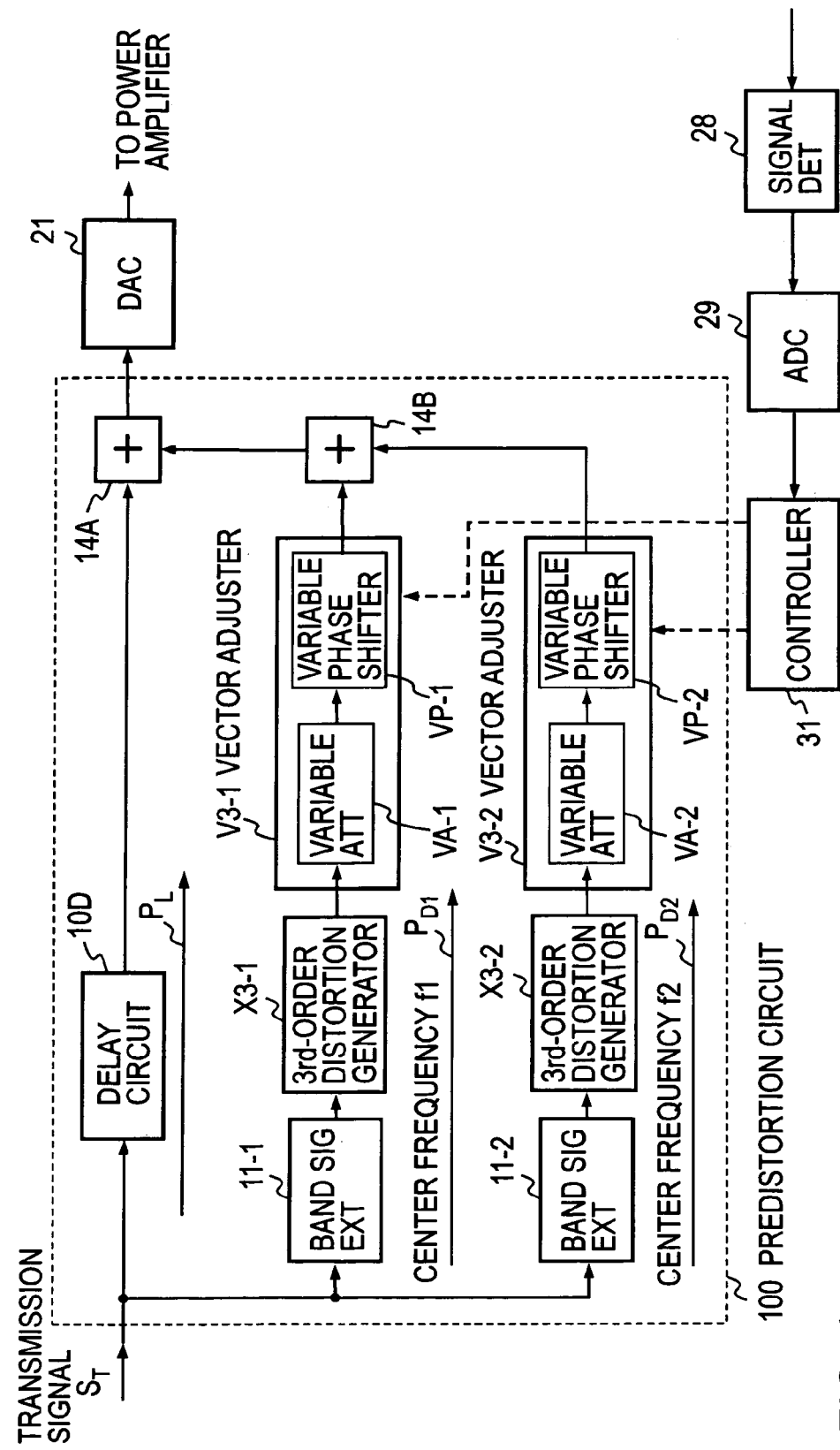
FIG. 1 is a block diagram illustrating a first embodiment of the multi-frequency band power series type predistorter according to the present invention.

FIG. 1 illustrates in block form a first embodiment of the power series type predistorter that carries out the present invention in the best mode. The predistorter includes a predistortion circuit 100 and a controller 31. The predistortion circuit 100 includes a linear signal transfer path $P_L$, a 3rd-order distortion generation path $P_{D1}$, a 3rd-order generation path $P_{D2}$, and combiners 14A, 14B for combining output signals from these paths. The illustrated predistorter is implemented by digital signal processing, and is compatible with first and second frequency bands (represented by center frequencies f1 and f2, respectively). In the case of a mobile radio communication system, f1 and f2 may be, for example, 800-MHz and 1.5-GHz bands, respectively, or they may be 1.5-GHz and 2-GHz bands, respectively. The number of frequency bands is not limited specifically to two, but more than two frequency bands can be used as desired. Furthermore, 5th or higher-order distortion generation paths may be added.

The input transmission signal $S_T$ is provided to the linear signal transfer path $P_L$, and first and second distortion generation paths $P_{D1}$ and $P_{D2}$ corresponding to two frequency bands. The first distortion generation path $P_{D1}$ is formed by a cascade connection of a band signal extractor 11-1 for the first frequency band, a 3rd-distortion generator X3-1, and a vector adjuster V3-1. The second distortion generation path $P_{D2}$ is formed by a cascade connection of a band signal extractor 11-2 for the second frequency band, a 3rd-distortion generator X3-2, and a vector adjuster V3-2. The outputs from the first and second distortion generation paths $P_{D1}$ and $P_{D2}$ are combined by the combiner 14B, and the combined output is combined by the combiner 14A to the output from the linear signal transfer path $P_L$. A delay circuit 10D of the linear signal transfer path $P_L$ can be formed, in this case, by a memory like a shift register, and in the case of the analog predistorter described later on, it may be formed by a delay line. The band signal extractors 11-1 and 11-2 may be formed by band pass filters or band elimination filters.

The signal of the frequency band f1, extracted by the band signal extractor 11-1, is applied to the 3rd-order distortion generator X3-1. The 3rd-order distortion generator X3-1 generates a 3rd-order distortion of the transmission signal of the frequency band f1. The vector adjuster V3-1 is formed by a cascade connection of a variable attenuator VA-1 and a variable phase shifter VP-1. The vector adjuster V3-1 is initialized so that the 3rd-distortion signal from the 3rd-distortion generator X3-1 has the same amplitude as that of but in a 180° out-of-phase relation to a 3rd-distortion component that is produced by a power amplifier (not shown) connected to the output side of the predistorter. The controller 31 controls the vector adjuster V3-1 to remain as-initialized.

Similarly, the signal of the frequency band f2, extracted by the band signal extractor 11-2, is applied to the 3rd-order distortion generator X3-2. The 3rd-order distortion generator X3-2 generates a 3rd-order distortion of the transmission signal of the frequency band f2. The vector adjuster V3-2 is also formed by a cascade connection of a variable attenuator VA-2 and a variable phase shifter VP-2. The vector adjuster V3-2 is initialized so that the 3rd-distortion signal from the 3rd-distortion generator X3-2 has the same amplitude as that of but in a 180° out-of-phase relation to the 3rd-distortion component of the frequency band f2 that is produced by a power amplifier (not shown) connected to the output side of the predistorter. The controller 31 controls the vector adjuster V3-2 to remain as-initialized.

The distortion components produced on the first and second distortion generation paths $P_{D1}$ and $P_{D2}$ are combined by the combiner 14B, then the combined output is combined by the combiner 14A with a delayed transmission signal from the linear signal transfer path $P_L$, and the combined output is converted by a digital-to-analog converter (DAC) 21 to an analog signal, which is provided as the output signal from the digital predistorter. This analog signal is amplified by a power amplifier (not shown), thereafter being radiated as radio waves from a transmitting antenna (not shown).

A portion of the transmission signal amplified by the power amplifier is extracted, for example, by a directional coupler (not shown), and detected by a signal detector 28. The detected transmission signal is converted by an analog-to-digital converter (ADC) 29 to a digital signal, which is input to the controller 31.

The controller 31 controls the vector adjusters V3-1 and V3-2 in such a manner as to minimize the 3rd-order distortion components of the transmission signals of the frequency bands f1 and f2 which are fed back via the analog-to-digital converter 29. To perform this, the signal detector 28 contains band signal extractors for extracting signals of the frequency bands f1 and f2.

The characteristics of the band signal extractors 11-1 and 11-2 have desired bandwidths with center frequencies f1 and f2, respectively, and they extract signals of the first and second frequency bands. Such frequency band signal extractors 11-1 and 11-2 may each be formed, for example, by a band pass filter (BPF), or band elimination filter (BEF). While the FIG. 1 embodiment is shown to generate 3rd-order distortions in the distortion generation paths $P_{D1}$ and $P_{D2}$ to compensate for the 3rd-order distortion generated by the power amplifier, it is general practice to make provision for creating the same odd-order distortion as that caused by the power amplifier to be compensated for.

Figure 2:
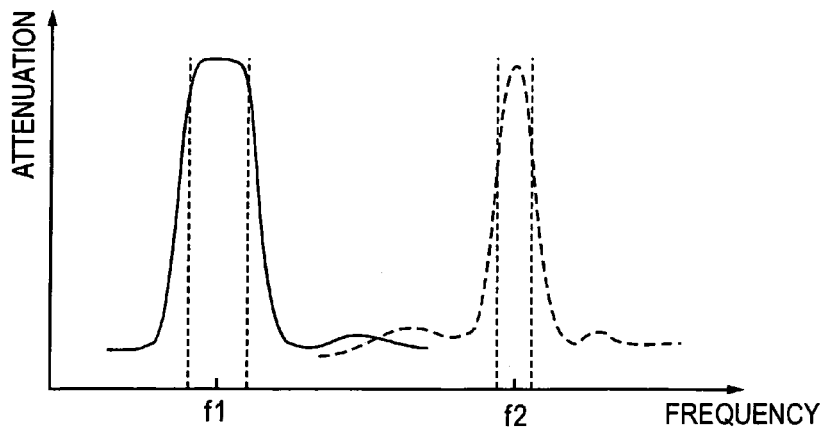
FIG. 2 is a graph for explaining frequency-attenuation characteristics of band pass filters used in the predistorter of the present invention as band signal extractors for frequency bands of center frequencies f1 and f1.

In FIG. 2, frequency-attenuation characteristics of the band signal extractors 11-1 and 11-2, each formed by a BPF, are conceptually shown by solid and broken lines, respectively. The characteristics need to be such that the amount of attenuation sharply increases outside the frequency bands f1 and f2, providing sufficient spacing between them. Such characteristics can be usually obtained by a cascade connection of multiple BPFs.

Figure 3:
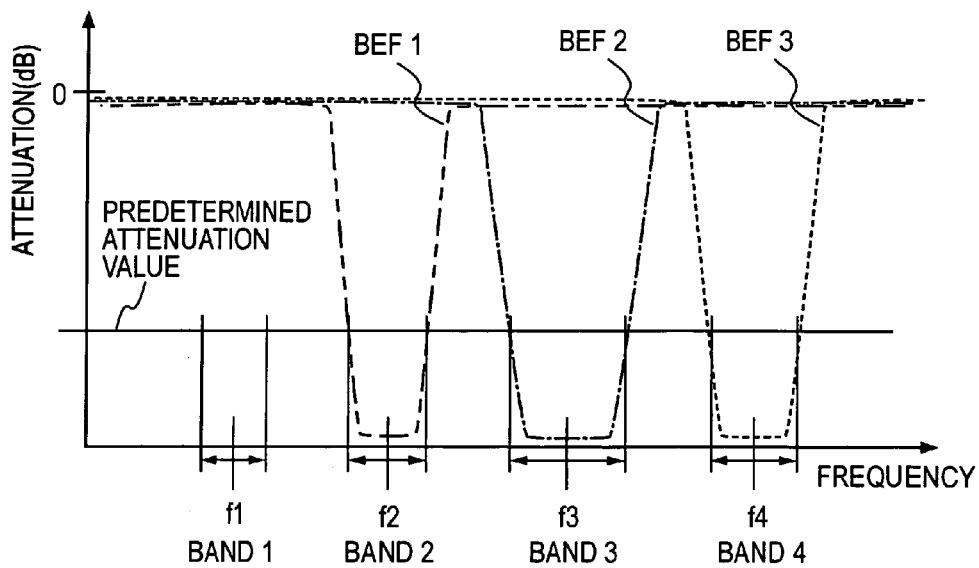
FIG. 3 is a graph for explaining characteristics of band signal extractors formed by band elimination filters.
Figure 4:
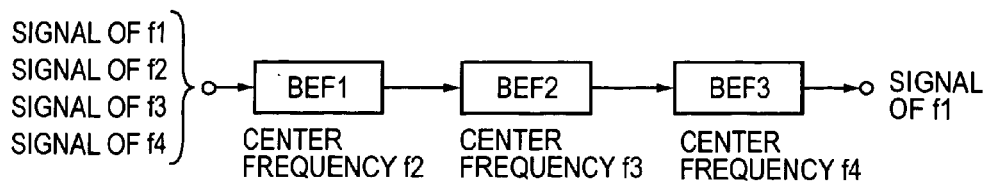
FIG. 4 is a diagram showing, by way of example, the configuration of the band signal extractor for the frequency band f1 formed by band elimination filters.

FIG. 3 shows frequency-attenuation characteristics of the band signal extractor 11-1 formed by a BEF, for instance. This example conceptually shows the characteristic that the first band signal extractor 11-1 is required to have when third and fourth distortion generation paths for frequency bands of center frequencies f3 and f4 are added to the predistorter of FIG. 1. The illustrated characteristic can be obtained, as is evident from FIG. 3, by such a cascade connection of three BEFs BEF1, BEF2 and BEF3 as shown in FIG. 4 which eliminate the second, third and fourth frequency bands f2, f3 and f4, respectively, except the first frequency band f1. Each BEF is so configured as to have a sufficient band elimination characteristic in the corresponding band and a sufficiently low-loss pass characteristics in the other bands. Such a BEF can be formed, for example, by a notch filter. The notch filter is a BEF using a dielectric resonator, a filter using a stub formed by a microstrip line, or the like. Though not shown, the characteristic of the second frequency band signal extractor 11-2 can also be obtained similarly by a cascade connection of three BEFs that eliminate the first, third and fourth frequency bands, respectively. The same holds true for third and fourth frequency band signal extractors that are not shown.

The use of the BPF for each frequency band signal extractor facilitates extraction of a signal around the center frequency and makes it relatively easy to provide isolation from the center frequencies of adjacent frequency bands. In this instance, however, since the center frequency is the resonance frequency of the BPF, a signal delay increases, and consequently it is necessary that the amount of delay of the delay circuit 10D forming the linear signal transfer path in FIG. 1 be increased in accordance with the signal delay—this impairs the stability of the predistorter. In particular, when the predistorter is formed by analog circuits as described later on, the delay line forming the delay circuit 10D of the linear signal transfer path $P_L$ becomes long, providing increased signal attenuation. With the use of the BEF for each frequency band signal extractor, the signal to be extracted is so sufficiently spaced away from the center frequency of the frequency band that the signal delay is small. This permits reduction in the line length of the linear signal transfer path 10 and in the amount of attenuation and hence in the propagation loss. Besides, it is also easy to design the BEF.

In all of the embodiments described hereafter, too, each band signal extractor may be formed by a BPF or BEF.

Embodiment 2

Figure 5:
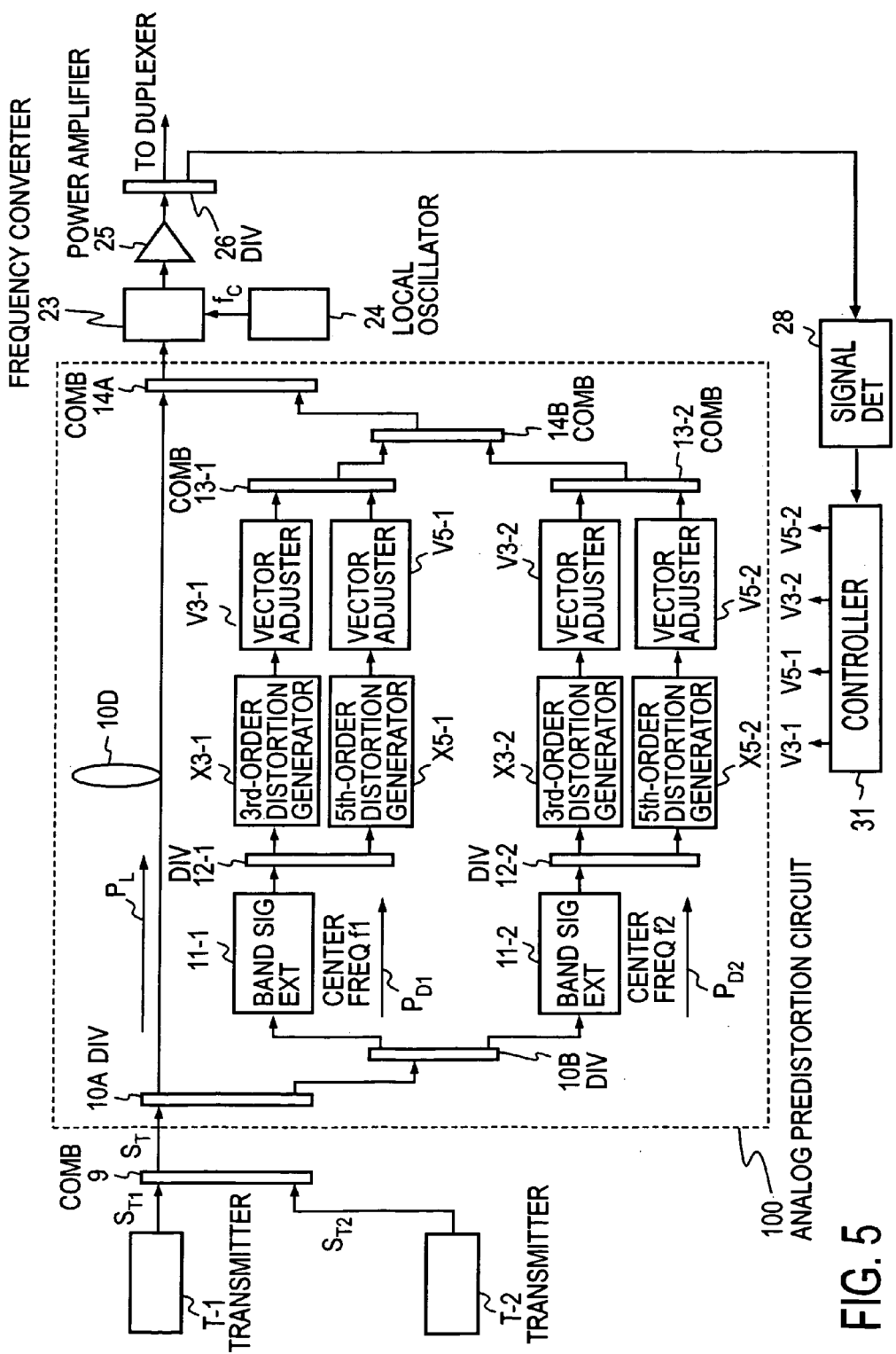
FIG. 5 is a block diagram illustrating a second embodiment of the present invention.

FIG. 5 illustrates in block form a second embodiment of the predistorter according to the present invention. The predistorter of this embodiment is formed by analog circuits, and intermediate-frequency signals $S_{T1}$ and $S_{T2}$ of the center frequencies f1 and f2 are input from transmitters T-1 and T-2. Let it be assumed that the center frequencies f1 and f2 of the input signals $S_{T1}$ and $S_{T2}$ be spaced hundreds of megahertz (MHz) apart, sufficiently larger than the bandwidth of each of the frequency bands of the input signals. Further, in this embodiment each of the distortion generation paths $P_{D1}$ and $P_{D2}$ for the frequency bands f1 and f2 is configured to create 3rd- and 5th-order distortions so as to compensate for 3rd- and 5th-order distortions caused by a power amplifier 25 in the corresponding frequency band.

A divider 10A at the input of the analog predistortion circuit 100 is formed by a wide band (wider than the bandwidth of the input signal) directional coupler or a wide band power divider. The distortion generation path $P_{D1}$ is provided with: a band signal extractor 11-1 for extracting a signal of the frequency band f1; a divider 12-1 for dividing the extracted signal into two; a 3rd-order distortion generator X3-1 supplied with one of the two divided outputs, for generating a 3rd-order distortion; a 5th-order distortion generator X5-1 supplied with the other divided output, for generating a 5th-order distortion; vector adjusters V3-1 and V5-1 for adjusting the phases and amplitudes of the outputs from the distortion generators X3-1 and X5-1, respectively; and a combiner 13-1 for combining the outputs from the vector adjusters V3-1 and V5-1.

Similarly, the distortion generation path $P_{D2}$ is provided with: a band signal extractor 11-2 for extracting a signal of the frequency band f2; a divider 12-2 for dividing the extracted signal into two; a 3rd-order distortion generator X3-2 supplied with one of the two divided outputs, for generating a 3rd-order distortion; a 5th-order distortion generator X5-2 supplied with the other divided output, for generating a 5th-order distortion; vector adjusters V3-2 and V5-2 for adjusting the phases and amplitudes of the outputs from the distortion generators X3-2 and X5-2, respectively; and a combiner 13-2 for combining the outputs from the vector adjusters V3-2 and V5-2. The outputs from the combiners 13-1 and 13-2 are combined by a combiner 14B, and the combined output is combined with the output from the linear signal transfer path $P_L$. As a result, the 3rd- and 5th-order distortions generated in the respective frequency bands are added as predistortions to the transmission signals of the frequency bands f1 and f2 transferred over the linear signal transfer path $P_L$.

The vector adjusters V3-1, V5-1 and V3-2, V5-2 are initialized so that the distortion components to be generated by the distortion generators X3-1, X5-1 and X3-2, X5-2 coincide in amplitude with but are 180° out of phase with the 3rd- and 5th-order distortions that are generated by the power amplifier 25 in the frequency bands f1 and f2, respectively. The vector adjusters V3-1, V5-1 and V3-2, V5-2 are held as-initialized under the control of the controller 31.

The output signal from the analog predistortion circuit 100 is applied to a frequency converter 23, wherein it is frequency converted to a predetermined transmission frequency band by a carrier signal from a local oscillator 24, and the thus frequency converted signal is provided to the power amplifier 25. The output from the power amplifier 25 is divided by a divider 26, serving as signal extracting means, into two, one of which is provided to a duplexer (not shown), and the other of which is applied to a signal detector 28. The signal detector 28 detects the 3rd- and 5th-order distortions produced by the power amplifier 25 in connection with the transmission signals $T_1$ and $T_2$, and applies the detected output signals to the controller 31. The controller 31 controls the vector adjusters V3-1, V5-1 and V3-2, V5-2 in such a manner as to minimize the detected 3rd- and 5th-order distortions. As a result, the predistortions added by the analog predistortion circuit 100 in the respective frequency bands cancel distortions that are generated by the power amplifier 25 during amplification of transmission signals of different frequency bands.

The intermodulation distortions that are generated by the transmission signals of multiple frequency bands occur at intervals of the frequency difference between the transmission bands, and such intermodulation distortions can easily be eliminated by the duplexer or BPF at the output of the power amplifier 25. The band signal extractors 11-1 and 11-2 may be implemented by a combination of directional couplers.

This embodiment has been described above to generate 3rd- and 5th-order distortions in the frequency bands f1 and f2, but the predistorter is configured to create distortions of required orders, depending on the characteristics of the power amplifier 25, such as a combination of the above-mentioned 3rd and 5th orders with a 7th one, or combination of any other required orders. Such a configuration can easily be extended from the FIG. 5 configuration. While this embodiment uses two frequency bands f1 and f2, the above configuration can easily be extended to increase the number of frequency bands. The same goes for the other embodiments of the invention described later on.

Embodiment 3

Figure 6:
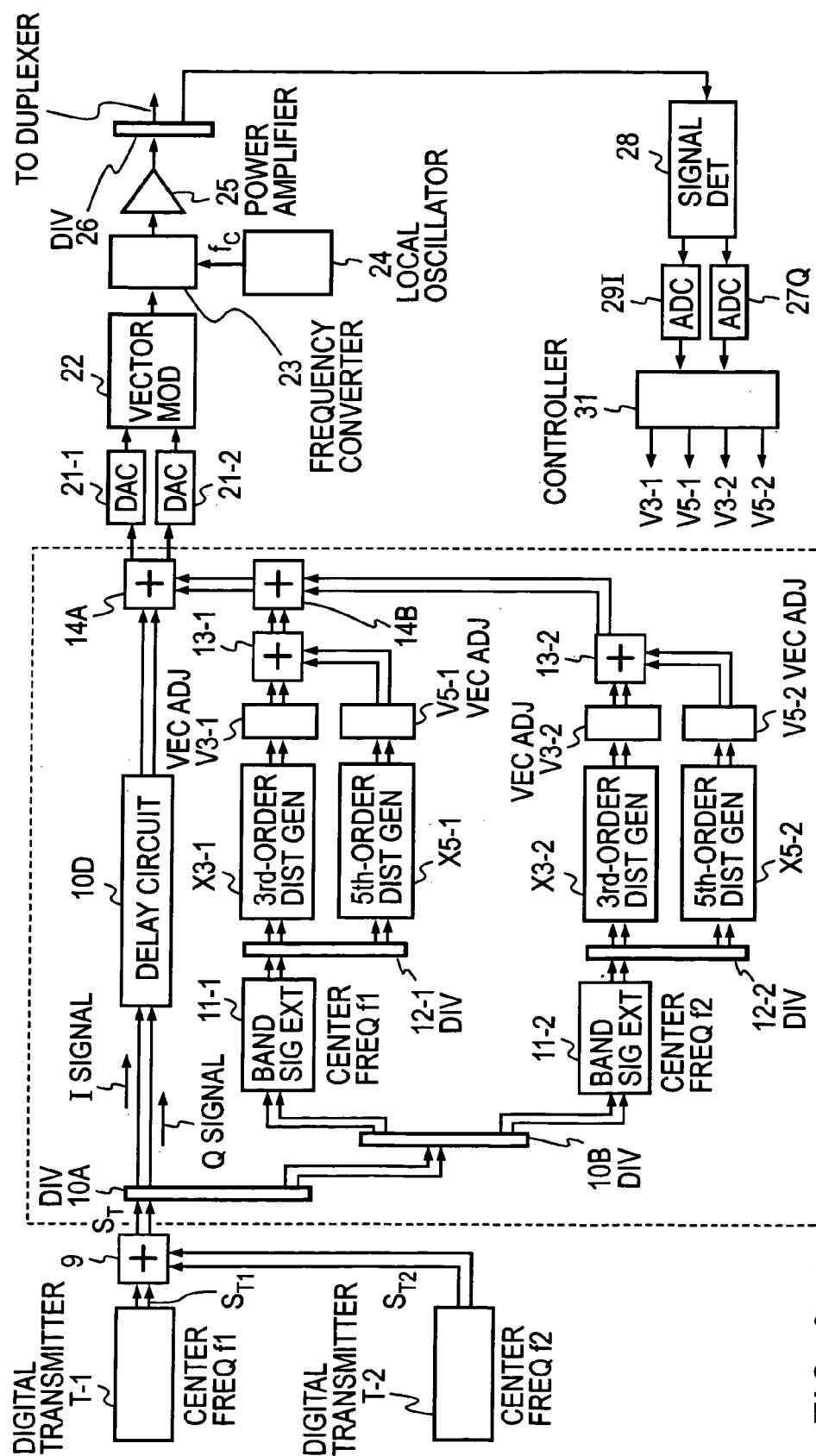
FIG. 6 is a block diagram illustrating a third embodiment of the present invention.

FIG. 6 illustrates in block form a third embodiment of the predistorter according to the present invention. This embodiment implements the analog predistorter of FIG. 5 by digital signal processing. The signal of each line is formed by a pair of an in-phase signal (I signal) and a quadrature signal (Q signal). In this embodiment, too, the predistortion circuit 100 is provided with: the divider 10A for dividing the input signal into two; the linear signal transfer path $P_L$ formed by the delay circuit 10D; the band signal extractor 11-1 for extracting the signal of the frequency band f1 by digital signal processing; the band signal extractor 11-2 for extracting the signal of the frequency band f2 by digital signal processing; the 3rd- and 5th-order distortion generators X3-1, X5-1 and X3-2, X5-2 for generating 3rd- and 5th-order distortions in the frequency bands f1 and f2; and vector adjusters V3-1, V5-1, V3-2, V5-2.

The combiners 13-1, 13-2, 14A and 14B in FIG. 5 are each formed by an adder in this embodiment. The signal detector 28 detects a pilot signal and outputs an in-phase component (I signal) and a quadrature component (Q signal). These signals are converted by analog-to-digital converters (ADC) 29I and 29Q to digital signals, which are applied to the controller 31. The controller 31 controls the vector adjusters V3-1, V5-1 and V3-2, V5-2 to minimize the levels of detected distortions.

Assume that the center frequencies f1 and f2 of the input signals be spaced hundreds of megahertz (MHz) apart, sufficiently larger than the bandwidth of each of the frequency bands of the input signals. The divider 10A at the input of the digital predistorter is formed by a combination of band pass filters implemented by digital signal processing. The band signal extractors 11-1 and 11-2 extract only signals of the frequency bands f1 and f2, respectively. The signal of the frequency band f1, extracted by the band signal extractor 11-1, is applied, in this embodiment, to the 3rd- and 5th-order distortion generators X3-1 and X5-1, which generate 3rd- and 5th-order distortions, respectively. The 3rd- and 5th-order distortions are provided to the vector adjusters V3-1 and V5-1, each formed by a cascade connection of a variable phase shifter and a variable attenuator, wherein the amplitudes and phases of the distortion components are adjusted by the controller 31 as described previously with reference to the first embodiment.

Similarly, the signal of the frequency band f2 extracted by the band signal extractor 11-2, is applied to the 3rd- and 5th-order distortion generators X3-2 and X5-2, which generate 3rd- and 5th-order distortions, respectively. The 3rd- and 5th-order distortions are amplitude- and phase-adjusted by the controller 31 in the vector adjusters V3-2 and V5-2 each formed by a cascade connection of a variable phase shifter and a variable attenuator.

In this way, the 3rd- and 5th-order distortion signals generated in the distortion generation paths $P_{D1}$ and $P_{D2}$ for the frequency bands f1 and f2 are combined by adders 13-1, 13-2 and 14B, and the added output is added by an adder 14A to the transmission signals output from the linear signal transfer path $P_L$. The combined signals are converted by digital-to-analog converters (DAC) 21-1 and 21-2 to analog signals. The analog signals are subjected to quadrature modulation by a vector modulator 22, then the quadrature-modulated signal is provided to the frequency converter 23, wherein it is frequency converted by a carrier signal of a frequency $f_c$ from the local oscillator 24, and the frequency-converted signal is amplified by the power amplifier 25. At this time, the 3rd- and 5th-order distortion signals added for each frequency band in the digital predistortion circuit 100 is cancelled with the distortion components caused by the power amplifier 25. The intermodulation distortions are caused by the transmission signals of the frequency bands f1 and f2 at intervals of the frequency difference between the transmission bands. Such intermodulation distortions occur outside the transmission frequency bands, and can easily be eliminated by the duplexer or BPF at the output of the power amplifier. While the embodiment uses two transmission frequency bands f1 and f2, the above configuration can easily be extended to increase the number of frequency bands.

Embodiment 4

Figure 7:
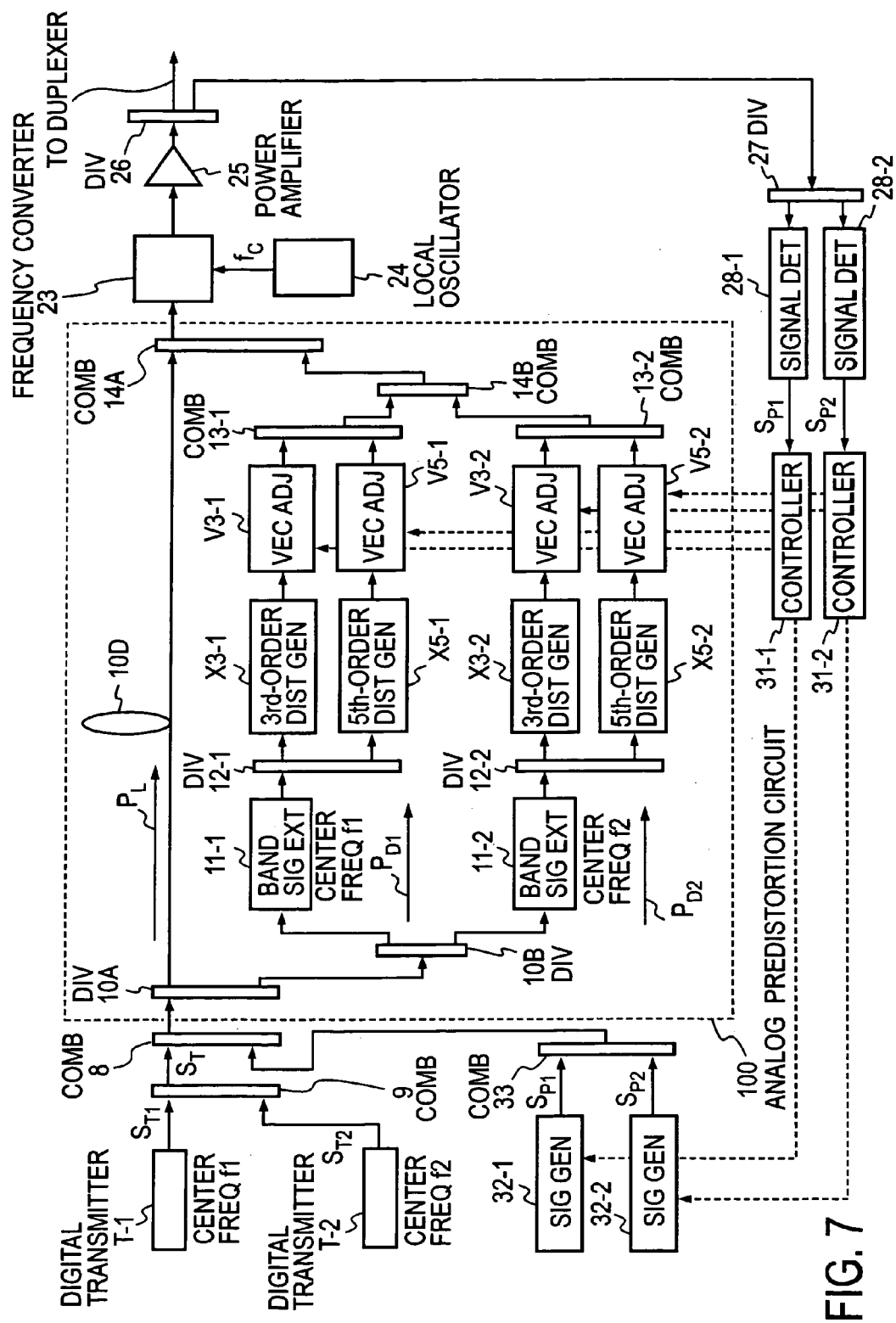
FIG. 7 is a block diagram illustrating a fourth embodiment of the present invention.

FIG. 7 illustrates in block form a fourth embodiment of the predistorter according to the present invention. This embodiment is a modified form of the FIG. 5 embodiment, in which pilot signals are used for automatic control of the vector adjusters V3-1, V5-1 and V3-2, V5-2. In this embodiment there are added: signal generators 32-1 and 32-2 for generating pilot signals $S_{P1}$ and $S_{P2}$ in the frequency bands f1 and f2; a combiner 33 for combining the pilot signals $S_{P1}$ and $S_{P2}$ of the two frequency bands f1 and f2; a combiner 8 for combining the combined pilot signals with the transmission signals $S_T$ and injecting the combined signal into the predistortion circuit 100; a divider 26 for dividing the output from the power amplifier 25 into two; a divider 27 for dividing one of the two divided outputs into two; and signal detectors 28-1 and 28-2 for detecting distortion components of the pilot signals $S_{P1}$ and $S_{P2}$ of the frequency bands f1 and f2 from the two divided signals. The distortion components detected by the signal detectors 28-1 and 28-2 are separately applied to two controllers 31-1 and 31-2 forming control means.

The signal generators 32-1 and 32-2 generate pilot signals $S_{P1}$ and $S_{P2}$ of the frequency bands f1 and f2, respectively. The pilot signals $S_{P1}$ and $S_{P2}$ are combined by the combiner 33, and the combined output is injected via the divider 8 into the input to the predistortion circuit 100. The output from the predistortion circuit 100 is applied to the frequency converter 23, wherein it is frequency converted by the carrier of the frequency $f_c$ from the local oscillator 24, and the frequency-converted output is provided to the power amplifier 25.

The following description will be given first of the configuration and control operation of the predistorter in the frequency band f1. As the pilot signal $S_{P1}$ is used two narrow-band CW signals (i.e., tone signals) spaced approximately 1 KHz apart, for instance. The frequency spacing needs only to be sufficiently narrower than the frequency bandwidth of the transmission signal $S_{T1}$. The pilot signal $S_{P1}$ is combined by the combiner 8 with the transmission signal, and the combined output is applied to the power series type predistortion circuit 100 similar to that described previously with reference to FIG. 5. The pilot signal $S_{P1}$ and the transmission signal $S_{T1}$ of the frequency band f1 are extracted by the frequency-band signal extractor 11-1, and the extracted output signal is applied via the divider 12-1 to the 3rd- and 5th-order distortion generators X3-1 and X5-1. The 3rd- and 5th-order distortion generators generate 3rd- and 5th-order distortion components of the pilot signal $S_{P1}$ and the transmission signal $S_{T1}$. These 3rd- and 5th-order distortion components are adjusted in amplitude and phase by the vector adjusters V3-1 and V5-1, respectively.

At the output of the power amplifier 25, the divider 26 extracts the pilot signal components. The divider 26 is formed by a directional coupler or power combiner and a BPF or BEF that serves as band signal extracting means provided at the output of the directional coupler or power combiner, and the divider 26 extracts the pilot signal components of desired frequency bands. From the extracted pilot signal components are detected by the signal detector 28-1 intermodulation distortion components of the two CW signals except the pilot signal $S_{P1}$ generated by the signal generator 32-1. The thus extracted distortion components are, for example, the 3rd-order distortion components yielded adjacent the both outsides (the higher and lower frequency sides) of the two CW pilot signals, and the 5th-order distortion components yielded next to the both sides of the 3rd-order distortion components. Specifically speaking, letting the center frequency of the two CW pilot signals $S_{P1}$ of the frequency band f1, for instance, be represented by $f_{P1}$ and the frequency spacing between the two waves by $f_0$, the frequencies of the 3rd- and 5th-order distortion components of the pilot signal of a frequency $f_{P1}$ are $f_{P1} \pm 3f_0$ and $f_{P1} \pm 5f_0$, respectively.

The controller 31-1 controls the vector adjuster V3-1 of the 3rd-order distortion generation path for the frequency band f1 in a manner to minimize the 3rd-order distortion component of the pilot signal $S_{P1}$. Similarly, the controller 31-1 controls the vector adjuster V5-1 of the 5th-order distortion generation path for the frequency band f1 in a manner to minimize the 5th-order distortion component of the pilot signal $S_{P1}$. In this way, the power series type predistorter of the frequency band f1 is operated.

The controller 31-1 changes, as required, the setting of the center frequency of the pilot signal $S_{P1}$ in the signal generator 32-1. By using pilot signals $S_{P1}$ of different center frequencies to control the vector adjusters V3-1 and V5-1, a wide-band distortion compensation can be achieved. By changing the setting of the frequency spacing between the two CW pilot signals $S_{P1}$, it is possible to compensate nonlinear characteristics of the power amplifier 26 that have a so-called memory effect. Furthermore, by changing the setting of the amplitude value of the pilot signal $S_{P1}$, the power combining ratio between the transmission signal $S_{T1}$ and the pilot signal $S_{P1}$ can be changed. This alleviates impaired power efficiency caused by the injection of the pilot signal $S_{P1}$.

Similarly, the signal generator 32-2 generates the pilot signal $S_{P2}$ that is used to control the vector adjuster V3-2 and V5-2 for the frequency band f1. In the same manner as described above in connection with the pilot signal $S_{P1}$ the pilot signal $S_{P2}$ is injected into the input signal to the analog predistortion circuit 100, and the vector adjusters V3-2 and V5-2 are controlled by the controller 31-2 to minimize the 3rd- and 5th-distortion components that are in the path for the detected pilot signal $S_{P2}$. Accordingly, no further description will be repeated.

In this embodiment, the vector adjusters V3-1 and V5-1 for the frequency band f1 are controlled by the controller 31-1, whereas the vector adjusters V3-2 and V5-2 for the frequency band f2 are controlled by the controller 31-2. The controllers 31-1 and 31-2 operate independently of each other. As a result, adjustments for distortion compensation can be made simultaneously in the two frequency bands f1 and f2.

While in the above each of the pilot signals $S_{P1}$ and $S_{P2}$ has been described as being two CW signals, narrow-band modulated signals may also be used. The controllers 31-1 and 31-2 in this embodiment can be adapted to control the vector adjusters without using the pilot signals $S_{P1}$ and $S_{P2}$. In such a case, the divider 26 is formed by a directional coupler or power divider, which extracts the transmission signal $S_{T1}$ or $S_{T2}$ from the transmitter T-1 or T-2. The signal detector 28-1 detects intermodulation distortion components from the transmission signal $S_{T1}$ or $S_{T2}$. The controller 31-1 controls the vector adjusters V3-1 and V5-1 of the distortion generation path for the frequency band f1 in such a manner as to minimize the detected intermodulation distortion components. The signal detector 28-2 detects intermodulation distortion components from the transmission signal $S_{T2}$. Thus it is possible to configure a power series type predistorter capable of simultaneously implementing distortion compensation in multiple frequency bands without employing the signal generators 32-1 and 32-2.

The signal detectors 31-1 and 31-2 have been described above to control the vector adjusters to minimize the detected distortion components. In the case where a predetermined out-band leakage power ratio is prescribed, the controllers control the vector adjusters so that the detected distortion components go down below the prescribed value.

That is, it is obvious that the vector adjusters need not necessarily be controlled until the detected distortion components are minimized.

The signal detectors 28-1 and 28-2 can each be formed by a level detector or correlator or coherent detector, depending on whether the pilot signals $S_{P1}$ and $S_{P2}$ are tone signals (CW signals) or modulated signals. This goes for the embodiments described hereinbelow.

Embodiment 5

Figure 8:
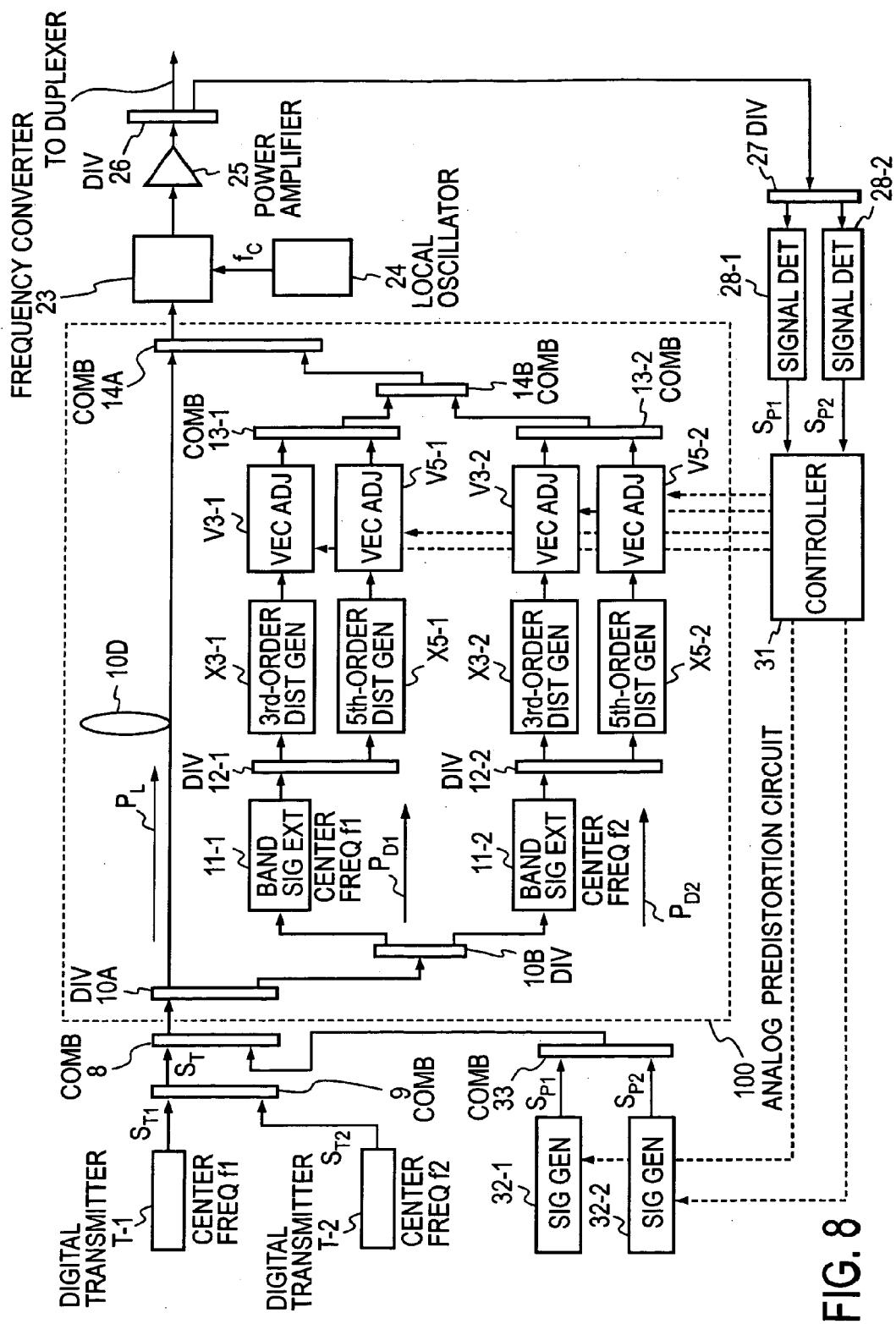
FIG. 8 is a block diagram illustrating a fifth embodiment of the present invention.

FIG. 8 illustrates in block form a fifth embodiment of the present invention. This embodiment is adapted to use one controller 31 to control all the vector adjusters instead of using the two controllers 31-1 and 31-2 in the FIG. 7 embodiment.

In this embodiment, the controller 31 simultaneously controls the vector adjusters V3-1, V5-1 for the frequency band f1 and the vector adjusters V3-2, V5-2 for the frequency band f2. When the distortion generation paths for the two frequency bands f1 and f2 are not sufficiently isolated from each other, the vector adjustments in the frequency bands f1 and f2 are mutually dependent on each other in accordance with the degree of isolation between the two distortion generation paths. In other words, the adjustment by the vector adjusters V3-1 and V5-1 for the frequency band f1 affects the adjustment by the vector adjusters V3-2 and V5-2 for the frequency band f2. The adjustment for the frequency band f1, even if made optimum, is caused to change by the control of the vector adjusters V3-2 and V5-2 for the frequency band f2. To solve such a problem, in this embodiment the intermodulation distortion components of the pilot signals $S_{P1}$ and $S_{P2}$ of the frequency bands f1 and f2 are simultaneously detected by the signal detectors 28-1 and 28-2. The controller 31 simultaneously controls the vector adjusters V3-1, V5-1 and V3-2, V5-2 for the frequency bands f1 and f2 to minimize the detected intermodulation distortion components. Thus, it is possible to configure the power series type predistorter that provide distortion compensation in the two frequency bands f1 and f2 at the same time. The controller 31 is may control the vector adjusters V3-1, V5-1 and V3-2, V5-2 alternately with each other.

While in the above each of the pilot signals $S_{P1}$ and $S_{P2}$ have been described as being two CW signals, narrow-band modulated signals may also be used. As described above with respect to the FIG. 7 embodiment, the controller 31 can be adapted to control the vector adjusters without using the pilot signals.

Embodiment 6

Figure 9:
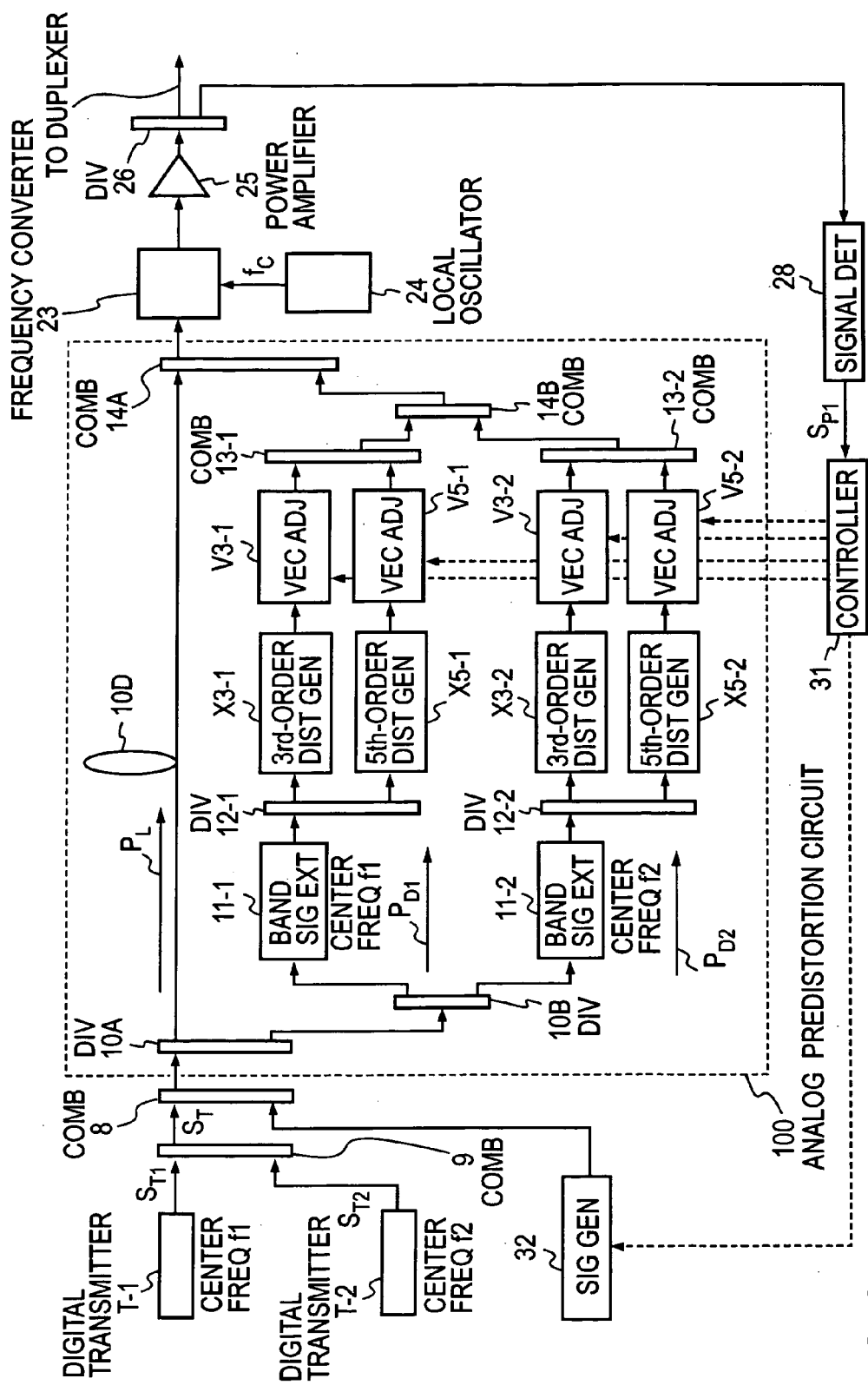
FIG. 9 is a block diagram illustrating a sixth embodiment of the present invention.

FIG. 9 illustrates in block form a sixth embodiment of the present invention. This embodiment is a modified form of the FIG. 8 embodiment, in which the two signal generators 32-1 and 32-2 for the frequency bands f1 and f2 are replaced with one signal generator 32 for generating the pilot signals $S_{P1}$ and $S_{P2}$ alternately with each other and the two signal detectors 28-1 and 28-2 are replaced with one signal detector 28. The controller 31 instructs the signal generator 32 to generate either one of the pilot signals $S_{P1}$ and $S_{P2}$. The signal detector 28 alternately detects the intermodulation distortion components of the pilot signals $S_{P1}$ and $S_{P2}$. The controller 31 alternately controls the vector adjusters for the frequency bands f1 and f2 with each other so that the detected intermodulation distortions are each minimized.

Thus a power series type predistorter can be configured to implement distortion compensation in the two frequency bands. The controller 31 may also be adapted to control the vector adjusters at the same time.

In the above each of the pilot signals $S_{P1}$ and $S_{P2}$ have been described as being two CW signals, but as described with reference to the foregoing embodiments, narrow-band modulated signals may also be used and it is also possible to control the vector adjusters without using the pilot signals.

Embodiment 7

Figure 10:
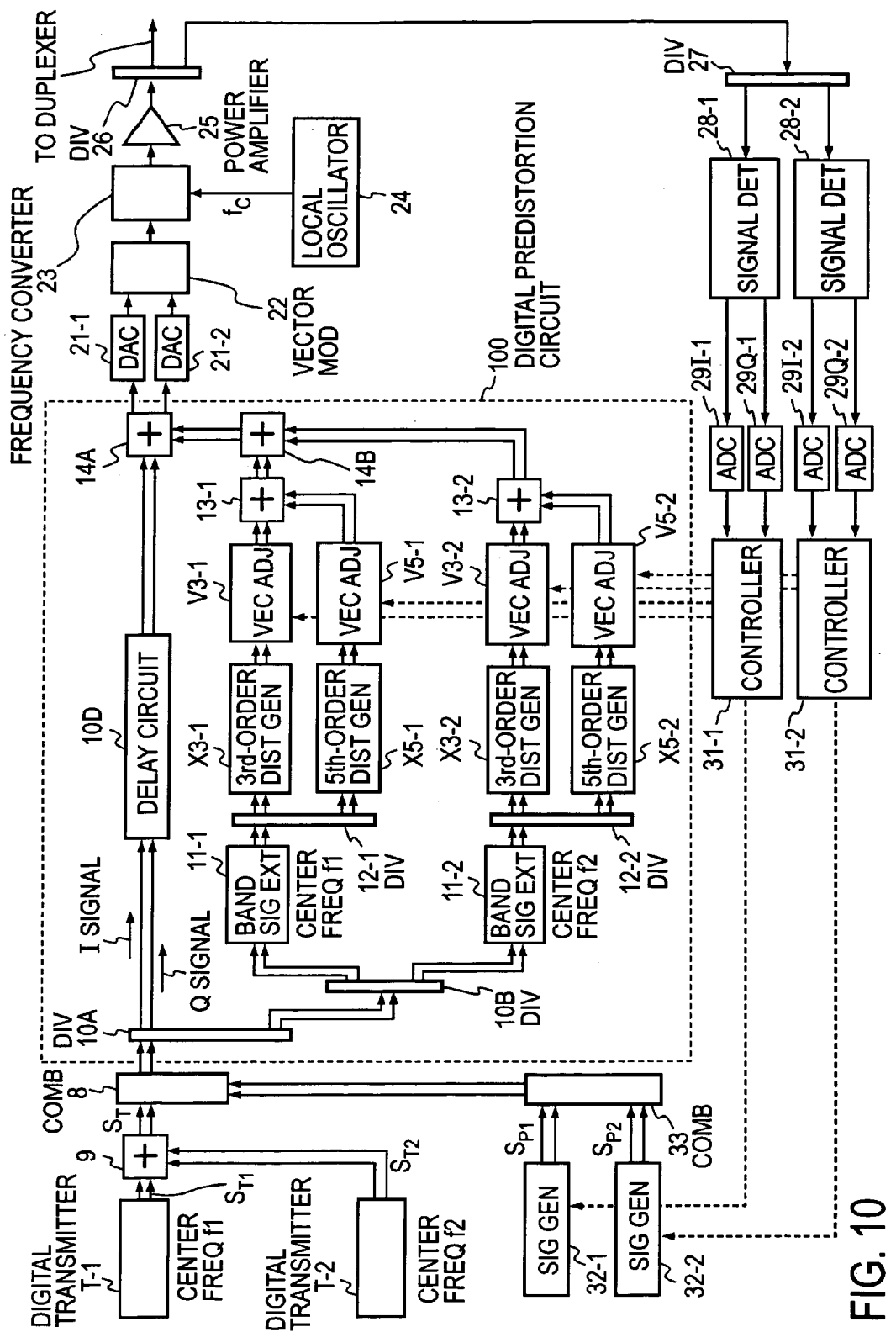
FIG. 10 is a block diagram illustrating a seventh embodiment of the present invention.

FIG. 10 illustrates in block form a seventh embodiment of the present invention, which implements the analog predistorter of FIG. 7 by digital signal processing. This embodiment is also configured to automatically control the vector adjusters by use of pilot signals of respective frequency bands in the FIG. 6 embodiment. In this embodiment, however, two signal generators 32-1 and 32-2 are provided in correspondence to two frequency bands, and a portion of the transmission signal is divided by the divider 26 into two signals, both of which are applied to the two signal detectors 28-1 and 28-2 and detected as I and Q signals of the distortion components. The detected outputs are converted by analog-to-digital converters (ADC) 29I-1, 29Q-1 And 29I-2, 29Q-2 to digital signals, which are applied to controllers 31-1 and 31-2.

The predistortion circuit 100 is identical in configuration and operation with the circuit 100 in FIG. 6, and the control of the vector adjusters V3-1, V5-1 and V3-2, V5-2 by the controllers 31-1 and 31-2 using the pilot signals $S_{P1}$ and $S_{P2}$ is the same as in the FIG. 7 embodiment; hence, no description will be repeated.

Embodiment 8

Figure 11:
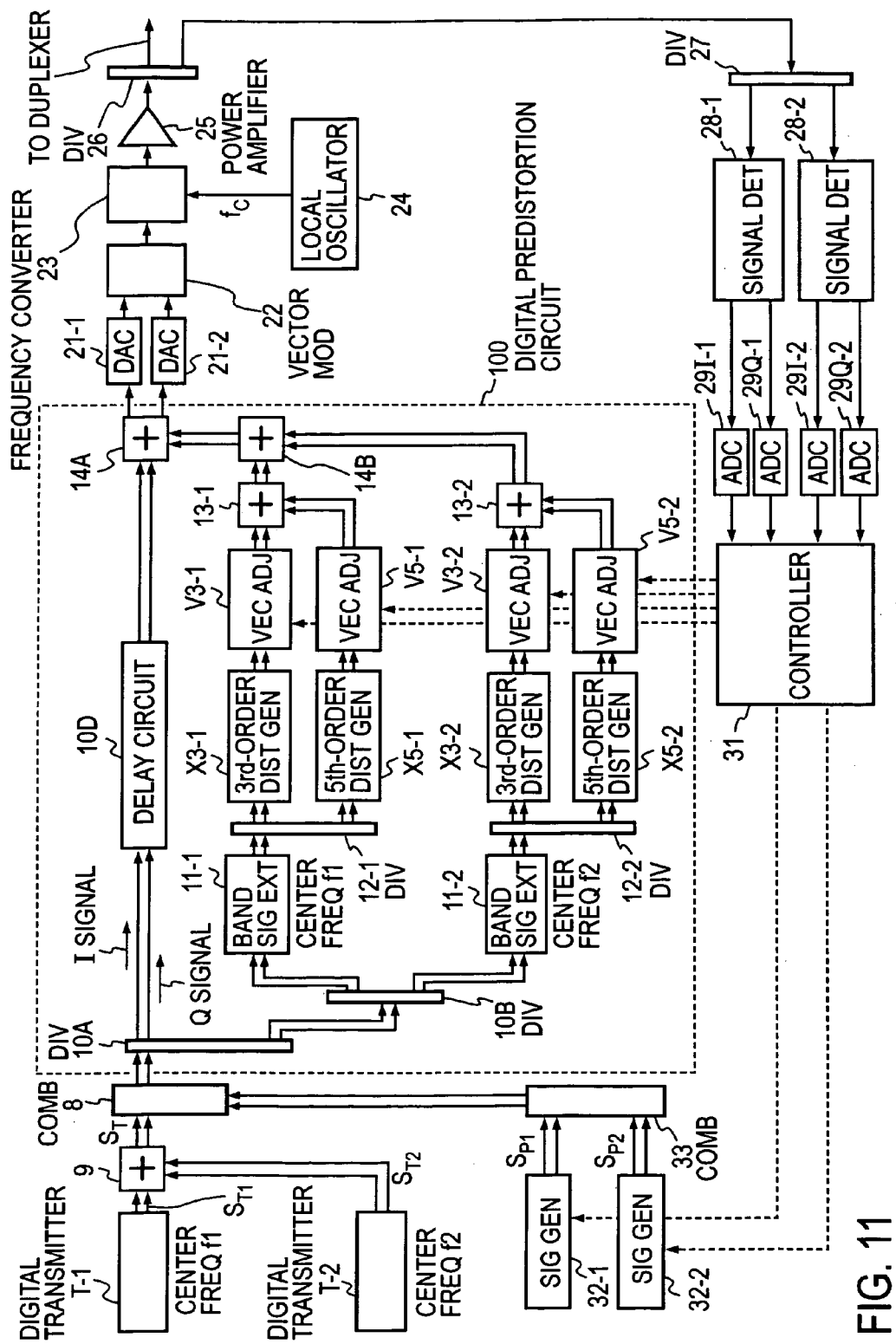
FIG. 11 is a block diagram illustrating an eighth embodiment of the present invention.

FIG. 11 illustrates in block form an eighth embodiment of the present invention, which implements the analog predistorter of FIG. 8 as a power series type predistorter of digital signal processing. The predistorter of this embodiment is identical in configuration with the FIG. 10 embodiment except the replacement of the two controllers 31-1 and 31-2 with one controller 31. Since the control of the vector adjusters V3-1, V5-1 and V3-2, V5-2 by the controller 31 using the pilot signals $S_{P1}$ and $S_{P2}$ is the same as in the FIG. 8 embodiment, no description will be repeated.

Embodiment 9

Figure 12:
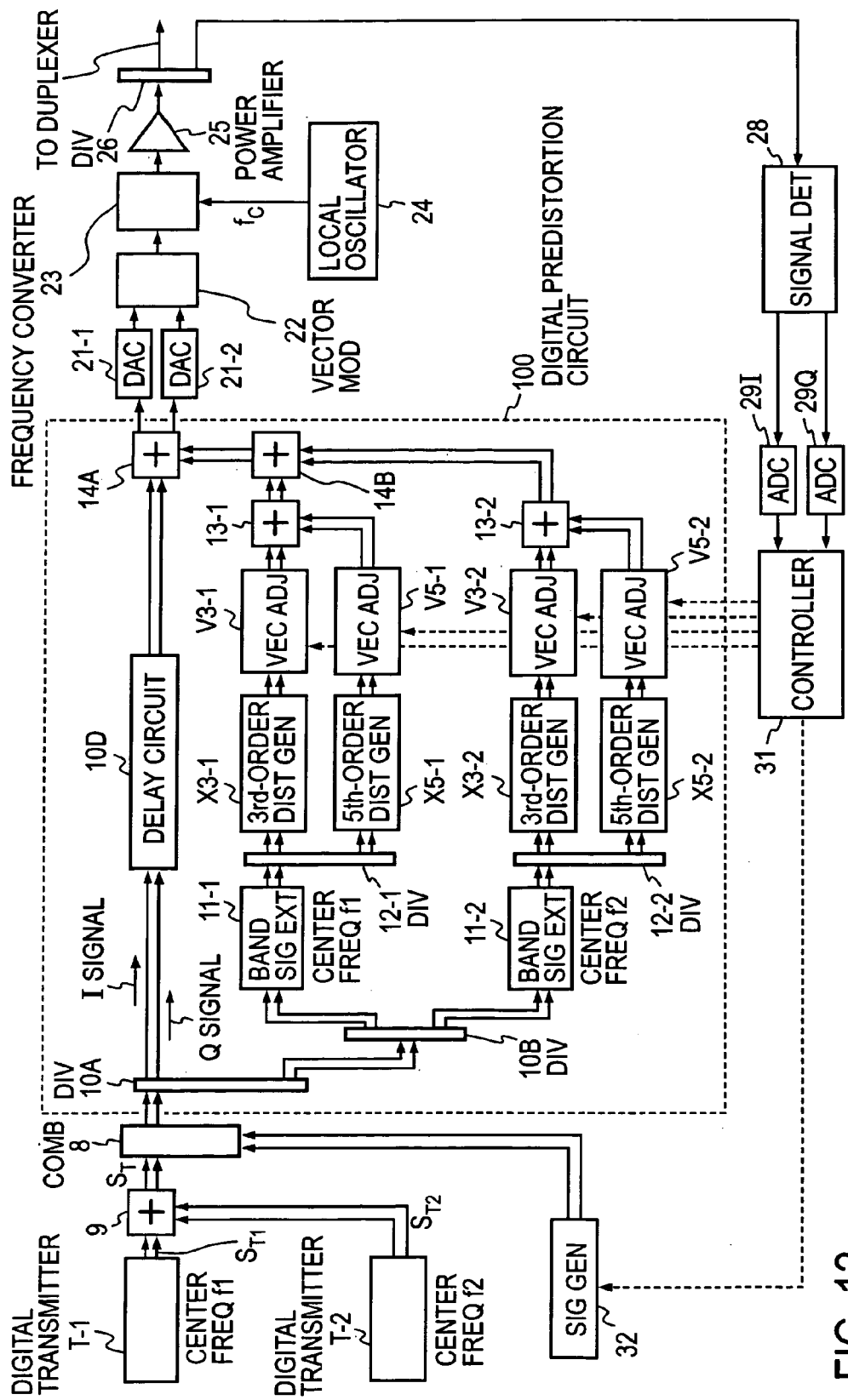
FIG. 12 is a block diagram illustrating a ninth embodiment of the present invention.

FIG. 12 illustrates in block form a ninth embodiment of the present invention, which implements the analog predistorter of FIG. 9 using one signal generator 32, as a power series type predistorter of digital signal processing. Since the control of the vector adjusters for the frequency bands f1 and f2 by the controller 32 is the same as in the FIG. 9 embodiment, no description will be repeated.

In the digital predistorters of the embodiments shown in FIGS. 1, 10, 11, and 12, the digital signal processing may be implemented by a computer under program control.

The multi-band power series type predistorter according to the present invention can be used, for example, in base stations of mobile communication systems that transmit signals of multiple frequency bands.

What is claimed is:

1. A multi-band predistorter using power series representation for compensating for distortions genreated by a power amplifier, said predistorter comprising:

dividing means for dividing input signals of multiple frequency bands and providing the divided input signals to a linear signal transfer path and a plurality of distortion generation paths for a plurality of frequency bands;

combining means for combining outputs from said linear signal transfer path and from said plurality of distortion generation paths; and a delay circuit provided in said linear signal transfer path;

wherein each of said plurality of distortion generation paths includes:

a band signal extractor for extracting a signal of corresponding one of said plurality of frequency bands from said divided input signals provided to said each distortion generation path; and a distortion generator supplied with said extracted signal, for generating at least one of odd-order distortion components of said extracted signal as an output from said each band-specific distortion generation path.

2. The multi-band predistorter using power series representaion of claim 1, further comprising a vector adjuster provided at an output side of said distortion generator of said each distortion generation path, for adjusting a phase and an amplitude of said at least one odd-order distortion component, and for providing said adjusted odd-order distortion component as the output from said each distortion generation path.

3. The multi-band predistorter using power series representation of claim 1, wherein said band signal extractor is a band pass filter.

4. The multi-band predistorter using power series representation of claim 1, wherein said band signal extractor is a band elimination filter.

5. The multi-band predistorter using power series representation of claim 1, wherein said each distortion generation path includes:

a plurality of distortion generators supplied with said extracted signal, for generating a plurality of different odd-order distortion components;

a plurality of vector adjusters for adjusting amplitudes and phases of the output signals from said plurality of distortion generators; and a second combiner for combining adjusted outputs from said plurality of vector adjusters into the output from said each band-specific distortion generation path.

6. The multi-band predistorter using power series representation of any one of claims 2 to 5, wherein said vector adjusters are each formed by a cascade connection of a variable attenuator and a variable phase shifter.

7. The multi-band predistorter using power series representation of any of claims 1 to 5 is implemented by digital signal processing.

8. The multi-band predistorter using power series representation of any of claims 1 to 5 is implemented by analog signal processing.

9. The multi-band predistorter using power series representation of claim 2 or 5, further comprising:

signal detecting means for detecting distortion components of said plurality of frequency bands from an output signal of said power amplifier; and control means supplied with said distortion components of said plurality of frequency bands, for controlling said vector adjusters corresponding to said plurality of frequency bands, respectively.

10. The multi-band predistorter using power series representation of claim 9, wherein:

said signal detecting means includes a plurality of signal detectors for detecting signal components of said plurality of frequency bands from the output signal of said power amplifier; and said control means includes a plurality of controllers for controlling said plurality of vector adjusters corresponding to said plurality of frequency bands, respectively, on a basis of the extracted signal components of said plurality of frequency bands.

11. The multi-band predistorter using power series representation of claim 9, wherein:

said signal detecting means includes one signal detector for detecting signal components of said plurality of frequency bands from the output signal of said power amplifier; and said control means includes one controller for controlling said plurality of vector adjusters corresponding to said plurality of frequency bands, respectively on a basis of the detected signal components of said plurality of frequency bands.

12. The multi-band predistorter using power series representation of claim 9, wherein:

said signal detecting means includes a plurality of signal detectors for detecting signal components of said plurality of frequency bands from the output signal of said power amplifier; and said control means includes a plurality of controllers for controlling said plurality of vector adjusters corresponding to said plurality of frequency bands, respectively, on a basis of the detected signal components of said plurality of frequency bands.

13. The multi-band predistorter using power series representation of claim 9, further comprising signal generating means for generating a plurality of pilot signals of said plurality of frequency bands, and signal injecting means for injecting said plurality of pilot signals into said divider.

14. The multi-band predistorter using power series representation of claim 13, wherein:

said signal generating means generates for each frequency band two CW signals of different frequencies; and said signal detecting means detects the two CW signals of different frequencies generated by said signal generating means.

15. The multi-band predistorter using power series representation of claim 13, wherein:

said signal generating means generates for each frequency band a modulated signal; and said signal detecting means detects the modulated signal generated by said signal generating means.

16. The multi-band predistorter using power series representation of claim 9, wherein said signal detecting means detects a distortion component of a transmission signal.

17. The multi-band predistorter using power series representation of claim 9, wherein said control means controls said plurality of vector adjusters in such manner as to minimize an output from said signal detecting means.

18. The multi-band predistorter using power series representation of claim 9, wherein said control means simultaneously controls said plurality of vector adjusters in such manner as to minimize an output from said signal detecting means.

19. The multi-band predistorter using power series representation of claim 9, wherein said control means controls said plurality of vector adjusters on a one-by-one basis in such manner as to minimize an output from said signal detecting means.

* * * * *